United States Patent
Furihata et al.

(10) Patent No.: US 9,385,253 B2
(45) Date of Patent: Jul. 5, 2016

(54) METHOD OF MANUFACTURING SOLAR CELL MODULE

(71) Applicant: SHIN-ETSU CHEMICAL CO., LTD., Tokyo (JP)

(72) Inventors: Tomoyoshi Furihata, Annaka (JP); Atsuo Ito, Annaka (JP); Hiroto Ohwada, Annaka (JP); Hyung Bae Kim, Annaka (JP); Sumio Sekiyama, Annaka (JP); Junichi Tsukada, Annaka (JP); Atsushi Yaginuma, Annaka (JP); Naoki Yamakawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 337 days.

(21) Appl. No.: 14/045,059

(22) Filed: Oct. 3, 2013

(65) Prior Publication Data

US 2014/0096885 A1 Apr. 10, 2014

(30) Foreign Application Priority Data

Oct. 4, 2012 (JP) .................................. 2012-221816

(51) Int. Cl.
*H01L 31/048* (2014.01)
*H01L 31/18* (2006.01)
(Continued)

(52) U.S. Cl.
CPC ............. *H01L 31/0488* (2013.01); *C08L 83/04* (2013.01); *H01L 31/048* (2013.01);
(Continued)

(58) Field of Classification Search
CPC ... H01L 31/0203; H01L 31/048; H01L 31/18; H01L 31/0488
See application file for complete search history.

(56) References Cited

U.S. PATENT DOCUMENTS

| 5,306,797 A | 4/1994 | Ikeno |
| 7,128,977 B2 | 10/2006 | Yamamoto et al. |

(Continued)

FOREIGN PATENT DOCUMENTS

| JP | 2005-179533 A | 7/2005 |
| JP | 2005-344106 A | 12/2005 |

(Continued)

OTHER PUBLICATIONS

Office Action dated May 19, 2015, issued in Japanese Patent Application No. 2012-121475 (2 pages) (counterpart to U.S. Appl. No. 13/904,569).

(Continued)

*Primary Examiner* — Christopher Schatz
(74) *Attorney, Agent, or Firm* — Westerman, Hattori, Daniels & Adrian, LLP (57) ABSTRACT

A method of manufacturing a solar cell module comprising adhering a first silicone gel sheet to one surface of a transparent light receiving panel to be a sunlight incidence surface; adhering a second silicone gel sheet to one surface of a light non-receiving panel or back sheet on the side opposite to the sunlight incidence surface; disposing a solar cell string on the first silicone gel sheet of the light receiving panel, and disposing butyl rubber in a picture frame-like shape along an outer peripheral region of a panel where either of the silicone gel sheets are not formed; and laying the light receiving panel and the light non-receiving panel or back sheet over each other with the silicone gel sheets on the inside, and pressing them at 100 to 150° C. in vacuum to encapsulate the solar cell string with the silicone gel sheets and press bond the light receiving panel and the light non-receiving panel or back sheet to each other through the butyl rubber.

2 Claims, 2 Drawing Sheets

(51) Int. Cl.
*C08L 83/04* (2006.01)
*C08G 77/12* (2006.01)
*C08G 77/20* (2006.01)

(52) U.S. Cl.
CPC ............ *H01L31/0481* (2013.01); *H01L 31/18* (2013.01); *C08G 77/12* (2013.01); *C08G 77/20* (2013.01); *Y02E 10/50* (2013.01); *Y10T 156/10* (2015.01)

(56) References Cited

U.S. PATENT DOCUMENTS

| | | | |
|---|---|---|---|
| 8,999,743 | B2 | 4/2015 | Furihata et al. |
| 2005/0250903 | A1 | 11/2005 | Tanaka et al. |
| 2006/0207646 | A1 | 9/2006 | Terreau et al. |
| 2006/0275617 | A1 | 12/2006 | Miyoshi et al. |
| 2008/0276983 | A1 | 11/2008 | Drake et al. |
| 2009/0159117 | A1 | 6/2009 | Ferri et al. |
| 2009/0194156 | A1 | 8/2009 | Grommesh et al. |
| 2009/0320921 | A1 | 12/2009 | Grommesh et al. |
| 2010/0275992 | A1 | 11/2010 | Watanabe |
| 2011/0005066 | A1 | 1/2011 | Crofoot et al. |
| 2011/0036389 | A1 | 2/2011 | Hardikar et al. |
| 2011/0036390 | A1 | 2/2011 | Nelson et al. |
| 2011/0061724 | A1 | 3/2011 | Houle et al. |
| 2011/0132437 | A1 | 6/2011 | Kost et al. |
| 2011/0139224 | A1 | 6/2011 | Krajewski |
| 2011/0203642 | A1 | 8/2011 | Byun et al. |
| 2011/0203665 | A1 | 8/2011 | Kataoka |
| 2011/0214716 | A1 | 9/2011 | Krajewski et al. |
| 2011/0247674 | A1 | 10/2011 | Fujii et al. |
| 2012/0017980 | A1 | 1/2012 | Lai |
| 2012/0129292 | A1 | 5/2012 | Safir |
| 2012/0266943 | A1 | 10/2012 | Li |
| 2012/0282725 | A1 | 11/2012 | Hong et al. |
| 2012/0282727 | A1 | 11/2012 | Basol |
| 2012/0318354 | A1 | 12/2012 | Zhao et al. |
| 2012/0318438 | A1 | 12/2012 | Muschiol |
| 2013/0068279 | A1 | 3/2013 | Buller et al. |
| 2013/0250229 | A1 | 9/2013 | Kaneiwa et al. |
| 2014/0099746 | A1 | 4/2014 | Furihata et al. |

FOREIGN PATENT DOCUMENTS

| | | |
|---|---|---|
| JP | 2007-527109 A | 9/2007 |
| JP | 2008-291148 A | 12/2008 |
| JP | 2009-515362 A | 4/2009 |
| JP | 2009-515365 A | 4/2009 |
| JP | 2011-514680 A | 5/2011 |
| JP | 2011-231309 A | 11/2011 |
| WO | 2009/091068 A1 | 7/2009 |
| WO | 2012/112000 A2 | 8/2012 |

OTHER PUBLICATIONS

Office Action dated Apr. 20, 2015, issued in U.S. Appl. No. 13/904,569 (26 pages).
Office Action dated Feb. 28, 2014 issued in U.S. Appl. No. 13/904,569 (23 pages).
Notification of Reasons for Rejection dated Aug. 18, 2015, issued in counterpart Japanese Patent Application No. 2012-221816 (2 pages).
Ohl, S., et al., "Increased Internal Quantum Efficiency of Encapsulated Solar Cell by Using Two-Component Silicone as Encapsulant Material", Proc. 23rd, EU PVSEC, Valencia (2008), pp. 2693-2697.
Ketola, B., et al., "Demonstration of the Benefits of Silicone Encapsulation of PV Modules in a Large Scale Outdoor Array", Dow Corning Corporation.
U.S. Office Action dated Nov. 24, 2014, issued in U.S. Appl. No. 13/904,569 (23 pages).
Office Action dated Nov. 4, 2015, issued in U.S. Appl. No. 14/045,352 (10 pages).

METHOD OF MANUFACTURING SOLAR CELL MODULE

CROSS-REFERENCE TO RELATED APPLICATION

This non-provisional application claims priority under 35 U.S.C. §119(a) on Patent Application No. 2012-221816 filed in Japan on Oct. 4, 2012, the entire contents of which are hereby incorporated by reference.

TECHNICAL FIELD

The present invention relates to a method of manufacturing a solar cell module.

BACKGROUND ART

As a measure to enhance the efficiency of solar cell modules and to secure their reliability over a long term from 20 years to more than 30 years, there have been made various reports and proposals with attention paid to encapsulant materials. In connection with enhancement of efficiency, it has been reported that silicones are advantageous, in internal quantum efficiency based on transmittance characteristics for light with wavelengths of around 300 to 400 nm, as compared with ethylene-vinyl acetate copolymer (hereinafter abridged to EVA) which is the main stream of encapsulant material at present (see, for example, S. Ohl, G. Hahn, "Increased internal quantum efficiency of encapsulated solar cell by using two-component silicone as encapsulant material," Proc. $23^{rd}$, EU PVSEC, Valencia (2008), pp. 2693-2697 (Non-patent Document 1)). In addition, comparative experiments in output electric power between the cases of practically using EVA and silicones, respectively, have also been reported (see, for example, Barry Ketola, Chris Shirk, Philip Griffith, Gabriela Bunea, "DEMONSTRATION OF THE BENEFITS OF SILICONE ENCAPSULATION OF PV MODULES IN A LARGE SCALE OUTDOOR ARRAY," Dow Corning Corporation (Non-patent Document 2)).

Originally, the use of silicones as encapsulant material was already achieved in the former half of the 1970s on the basis of manufacture of solar cells for space use. In manufacturing solar cells for ground use, however, there were problems as to the cost of silicones and as to workability in encapsulating the solar cells with silicones. In view of these problems, silicones were replaced by EVA which was available at low cost and in film form in those days.

In recent years, however, close attention has come to be again paid to enhancement of efficiency and long-term reliability of solar cells. At the same time, the performance of silicones as encapsulant material (for example, low modulus properties, high transparency, and high weatherability) has come to be highly evaluated again. Thus, a variety of new encapsulating methods based on the use of silicones have been proposed.

For instance, in JP-A 2009-515355 (Patent Document 1), there is proposed encapsulation with a hot melt type sheet composed mainly of an organopolysiloxane. However, it is difficult to process the material into a single-layer sheet form while maintaining high transparency. For example, in order to process the material into a thickness of around 1 mm, the processing method is limited to casting, and pressing, due to the "brittleness" of the material. Thus, the material is not suited to mass production. In addition, although the "brittleness" can be improved by enhancing moldability (formability) through admixing the material with filler, this approach is disadvantageous in that it becomes impossible to maintain high transparency. In JP-A 2007-527109 (Patent Document 2), there is proposed a process in which interconnected solar cells are disposed on or in a liquid silicone material which coats over a substrate by use of a multi-axis robot, after which the silicone material is cured to achieve encapsulation, without air bubble entrapment. In addition, in JP-A 2011-514690 (Patent Document 3), there is proposed a process in which solar cells are disposed on a cured or semi-cured silicone in a vacuum by use of a cell press having a movable plate, to achieve encapsulation without air bubble entrapment. On the other hand, in WO 2009/091063 (Patent Document 4), there is proposed a process in which an encapsulant material, solar cells, and liquid silicone material are disposed on a glass substrate, and a back surface protective substrate is finally laid over them to form a temporary laminated body, which is pressed into close contact in vacuum at room temperature, thereby achieving encapsulation. In this method, however, it may be difficult to develop the solar cell module to the practical-use size. In any one of these processes, a step of applying or disposing a liquid silicone material is involved before or after a solar cell encapsulating step. Quite unlike the currently adopted encapsulating process based on the use of EVA, this step greatly hampers the application of silicones as encapsulant material in the solar cell module manufacturing industry. In short, any one of the above-mentioned processes proposed in the patent documents differs greatly from the conventional solar cell encapsulating method, and may be impossible to deal with the current mass-production equipment.

CITATION LIST

Patent Document 1: JP-A 2009-515365 corresponding to US 2008/276983 A1
Patent Document 2: JP-A 2007-527109 corresponding to US 2006/707646 A1
Patent Document 3: JP-A 2011-514680 corresponding to US 2011/005066 A1
Patent Document 4: WO 7009/091068 corresponding to US 2010/775997 A1
Non-patent Document 1: S. Ohl, G. Hahn, "Increased internal quantum efficiency of encapsulated solar cell by using two-component silicone as encapsulant material,"Proc. $23^{rd}$, EU PVSEC, Valencia (2008), pp. 2693-2697
Non-patent Document 2: Barry Ketola, Chris Shirk, Philip Griffith, Gabriela Bunea, "DEMONSTRATION OF THE BENEFITS OF SILICONE ENCAPSULATION OF PV MODULES IN A LARGE SCALE OUTDOOR ARRAY," Dow Corning Corporation

DISCLOSURE OF INVENTION

It is an object of the present invention to provide a method of manufacturing a solar cell module capable of using a conventional solar cell module manufacturing equipment by using silicone gel sheets in encapsulating a solar cell string with silicone as an encapsulant material.

The present inventors made intensive and extensive investigations in order to attain the above object. As a result, the present inventors have found a promising method of manufacturing a solar cell module. In this method, silicone gel sheets are adhered respectively to a sunlight receiving panel and a sunlight non-receiving panel or back sheet on the side opposite to the sunlight receiving surface, of a solar cell module. Thereafter, a solar cell string is disposed on the silicone gel sheet on the panel on the light receiving surface side or the opposite side, and butyl rubber is disposed in a picture frame-like shape along an outer peripheral region of a panel where either of the silicone gel sheets are not formed. Then, the light receiving panel and the light non-receiving panel or back sheet on the opposite side are laid over each other, and, in this condition, they are pressed at 100 to 150° C. in vacuum to sandwich the solar cell string between the silicone gel sheets, thereby manufacturing a solar cell module. It has been found that, according to this manufacturing method, an application device for using silicone as encapsulant material is not needed, and that a vacuum laminator which has been used as the solar cell module manufacturing equipment in the related art can be employed.

Thus, according to the present invention, there, is provided a method of manufacturing a solar cell module represented by the following [1] to [3].

[1] A method of manufacturing a solar cell module comprising:

adhering a first silicone gel sheet to one surface of a transparent light receiving panel to be a sunlight incidence surface;

adhering a second silicone gel sheet to one surface of a light non-receiving panel or back sheet on the side opposite to the sunlight incidence surface;

disposing a solar cell string on the first silicone gel sheet of the light receiving panel or on the second silicone gel sheet of the light non-receiving panel or back sheet, and disposing butyl rubber in a picture frame-like shape along an outer peripheral region of a panel where either of the silicone gel sheets are not formed; and laying the light receiving panel and the light non-receiving panel or back sheet over each other with the silicone gel sheets on the inside, and pressing them at 100 to 150° C. in vacuum to encapsulate the solar cell string with the silicone gel sheets and press bond the light receiving panel and the light non-receiving panel or back sheet to each other through the butyl rubber.

[2] The method of manufacturing a solar cell module according to [1], wherein the silicone gel sheet is a sheet of a silicone gel obtained by curing a silicone gel composition comprising:

(A) an organopolysiloxane having at least one silicon-bonded alkenyl group in one molecule and represented by the following average compositional formula (1):

$$R_a R^1_b SiO_{(4-a-b)/2} \quad (1)$$

wherein R is an alkenyl group, $R^1$ is independently an unsubstituted or substituted monovalent hydrocarbon group not having any aliphatic unsaturated bond, a is a positive number of 0.0001 to 0.2, b is a positive number of 1.7 to 2.2, and a+b is 1.9 to 2.4;

(B) an organohydrogenpolysiloxane having at least two silicon-bonded hydrogen atoms in one molecule; and (C) a platinum catalyst, the silicone gel having a penetration of 30 to 200.

[3] The method of manufacturing a solar cell module according to [1] or [2], wherein the thickness of the silicone gel sheet is 200 to 1,000 μm.

Advantageous Effects of Invention

The method of manufacturing a solar cell module according to the present invention ensures that a vacuum laminator, which is an equipment used for manufacturing a solar cell module using EVA films in the related art, can be employed in carrying out a process of adhering silicone gel sheets respectively to a transparent light receiving panel on the side of a sunlight incidence surface and a light non-receiving panel or back sheet on the side opposite to the sunlight incidence surface, disposing a solar cell string on the silicone gel sheet on the light receiving surface side or the light non-receiving surface side, simultaneously disposing butyl rubber in a picture frame-like shape along an outer peripheral region of a panel where either of the silicone gel sheets are not formed, laying the light receiving panel and the light non-receiving panel or back sheet over each other, and pressing them at 100 to 150° C. in vacuum to encapsulate the solar cell string between the silicone gel sheets, in other words, a process of encapsulating the solar cell strings between the transparent light receiving panel on the light receiving surface side and the light non-receiving panel or back sheet to which the silicone gel sheets have been adhered respectively. Consequently, a solar cell module can be manufactured without preparing a liquid silicone applying device, which has been needed for manufacturing a silicone-encapsulated solar cell module in the related art.

DESCRIPTION OF EMBODIMENTS

Now, preferred embodiments of the method of manufacturing a solar cell module of the present invention will be described below.

In the method of manufacturing a solar cell module of the present invention, silicone gel sheets are used for encapsulation of a solar cell string.

In the case of obtaining a silicone gel sheet, a silicone gel composition is applied to a base member and is cured to form a silicone gel layer, and, if required, a protective sheet is peelably laid on the silicone gel layer. Incidentally, as the base member, there is preferably used a base member from which the silicone gel layer (silicone gel sheet) can be peeled off. Specifically, a flexible thin sheet-shaped material such as polyethylene terephthalate film, polypropylene film, papers, and fabrics is used as the base member. Ordinarily, a material wound into a roll form is used as the base member. The base member is continuously coated with the silicone gel material (composition) described below by use of a coating apparatus. As the coating apparatus, one of those which have been known such as comma coater, reverse coater, bar coater, and die coater is used. After the silicone gel material is applied to the base member by use of the coating apparatus, the silicone gel material is cured by heating at 100 to 300° C. for about five minutes, to form a silicone gel sheet. The heating temperature is preferably in the range of 120 to 200° C. A protective sheet is adhered to a surface, on the silicone gel side, of the silicone gel sheet formed in this manner, whereby the silicone gel sheet is protected and handling thereof is facilitated. As the material for the protective sheet, a flexible thin sheet-shaped material such as polyethylene terephthalate film, polypropylene film, papers, and fabrics is used, like the material for the base member.

It is preferable on a practical use basis to control the thickness of the silicone gel sheet to within the range of 200 to 1,000 μm, more preferably 300 to 800 μm. If the thickness is less than 200 μm, it becomes difficult for the advantageous features of the cured silicone gel product such as low modulus and low hardness to be displayed. As a result, solar cell elements may be cracked in the manufacturing process in which the solar cell elements including a semiconductor substrate are sandwiched between panels. Especially, in outdoor environments where temperature variations are generated, it may become impossible for differences in linear expansion coefficient or modulus between the solar cell element surface and a wiring connection part to be absorbed, leading to embrittlement of the solar cell elements. On the other hand, if the thickness is larger than 1,000 μm, longer time is required for curing of the silicone gel sheet, and the amount of silicone gel to be used is increased, possibly leading to a rise in cost.

Furthermore, the penetration of the silicone gel after curing thereof, in terms of penetration measured by use of a ¼ cone according to JIS K 2220, is preferably 30 to 200, more preferably 40 to 150. If the penetration is below 30, it becomes difficult for the advantageous features of the cured silicone gel product such as low modulus and low hardness to be displayed. Consequently, solar cell elements may be cracked in the manufacturing process in which the solar cell elements including a semiconductor substrate are sandwiched between panels. Particularly, in outdoor environments where temperature variations are generated, it may become impossible for differences in linear expansion coefficient or modulus between the solar cell element surface and a wiring connection part to be absorbed, leading to embrittlement of the solar cell elements. If the penetration exceeds 200, on the other hand, the cured silicone gel product would become unable to maintain its form and would flow.

Now, the silicone gel composition will be described below. The silicone gel composition may be crosslinked by a method of any of condensation curing type, UV curing type, organic peroxide curing type, and addition curing type based on the use of a platinum catalyst. The silicone gel is preferably composed of a cured product of an addition-curable silicone gel composition which involves no by-products and which is little susceptible to discoloration. Specifically, the silicone gel composition to be used comprises:

(A) an organopolysiloxane having at least one silicon-bonded alkenyl group in one molecule represented by the following average compositional formula (1):

$$R_a R^1_b SiO_{(4-a-b)/2} \quad (1)$$

where R is an alkenyl group, $R^1$ is independently an unsubstituted or substituted monovalent hydrocarbon group not having any aliphatic unsaturated bond, a is a positive number of 0.0001 to 0.2, b is a positive number of 1.7 to 2.2, and a+b is 1.9 to 2.4;

(B) an organohydrogenpolysiloxane having at least two silicon-bonded hydrogen atoms in one molecule; and (C) a platinum catalyst.

The component (A) is a main component (base polymer) of the silicone gel composition. The component (A) is an organopolysiloxane which has at least one silicon-bonded alkenyl group (the expression "silicon-bonded alkenyl group" herein means an alkenyl group bonded to a silicon atom), preferably at least two silicon-bonded alkenyl groups in one molecule and which is represented by the above-mentioned average compositional formula (1).

In the above formula (1), R is an alkenyl group having 2 to 6 carbon atoms, preferably 2 to 4 carbon atoms, and more preferably 2 to 3 carbon atoms. Specific examples of the alkenyl group include vinyl, allyl, propenyl, isopropenyl, butenyl, and isobutenyl groups, among which preferred is vinyl group. $R^1$ is independently an unsubstituted or substituted monovalent hydrocarbon group which does not have any aliphatic unsaturated bond and which has 1 to 10 carbon atoms, preferably 1 to 6 carbon atoms. Specific examples of the hydrocarbon group include: alkyl groups such as methyl, ethyl, propyl, isopropyl, butyl, isobutyl, tert-butyl, pentyl, hexyl, cyclohexyl, octyl, and decyl groups; aryl groups such as phenyl and tolyl groups; aralkyl groups such as benzyl, and phenylethyl groups; substituted groups obtained by substituting at least one hydrogen atoms in the unsubstituted group with a halogen atom such as chlorine, bromine, and fluorine, such as chloromethyl and 3,3,3-trifluoropropyl groups. Among these groups, preferred in view of easy synthesis are methyl, phenyl, and 3,3,3-trifluoropropyl groups.

In addition, letter a should be a positive number of 0.0001 to 0.2, and is preferably a positive number of 0.0005 to 0.1, while letter b should be a positive number of 1.7 to 2.2, and is preferably a positive number of 1.9 to 2.02, provided that a+b should be in the range of 1.9 to 2.4, and is preferably in the range of 1.95 to 2.05.

This component should have at least one silicon-bonded alkenyl group, preferably 2 to 50 silicon-bonded alkenyl groups, and more preferably 2 to 10 silicon-bonded alkenyl groups in one molecule. It suffices for the values of the above-mentioned a and b to be so selected that this condition concerning the silicon-bonded alkenyl groups is satisfied.

The molecular structure of the organopolysiloxane is not particularly restricted, and may be a straight chain structure or may be a branched chain structure which includes, for example, an $R^1SiO_{3/2}$ unit ($R^1$ is the same as above-mentioned), an $R^1SiO_{3/2}$ unit ($R^1$ is the same as above-mentioned), or an $SiO_2$ unit. Preferably, the organopolysiloxane is a straight chain diorganopolysiloxane wherein the backbone chain is basically composed of repetition of diorganosiloxane units and both ends of the molecular chain are each capped (blocked) with a triorganosiloxy group, typically an organopolysiloxane represented by the following general formula (1a):

In the formula (1a), $R^2$ is independently an unsubstituted or substituted monovalent hydrocarbon group which does not have any aliphatic unsaturated bond, and $R^3$ is independently an unsubstituted or substituted monovalent hydrocarbon group which does not have any aliphatic unsaturated bond or an alkenyl group, provided that at least one of the groups $R^3$ is an alkenyl group. In the case where either of the groups $R^3$ at both ends of the molecular chain is an alkenyl group, k is an integer of 40, to 1,200, m is an integer of 0 to 50, and n is an integer of 0 to 50. In the case where neither of the groups $R^3$ at both ends of the molecular chain is an alkenyl group, k is an integer of 40 to 1,200, m is an integer of 1 to 50, particularly an integer of 2 to 50, and n is an integer of 0 to 50, provided that m+n is at least 1, preferably at least 2.

In the above formula (1a), the unsubstituted or substituted monovalent hydrocarbon group which does not have any aliphatic unsaturated bond such as an alkenyl group and which is represented by $R^2$ has 1 to 10 carbon atoms, preferably 1 to 6 carbon atoms. Specific examples of the group $R^2$ include the groups mentioned above as examples of the group $R^1$, among which preferred in view of easy synthesis are methyl, phenyl, and 3,3,3-trifluoropropyl groups.

In addition, the unsubstituted or substituted monovalent hydrocarbon group which does not have any aliphatic unsaturated bond and which is represented by $R^3$ has 1 to 10 carbon atoms, preferably 1 to 6 carbon atoms. Specific examples of the group $R^3$ include the groups mentioned above as examples of the group $R^1$, among which preferred in view of easy synthesis are methyl, phenyl, and 3,3,3-trifluoropropyl groups. The alkenyl group represented by $R^3$ has 2 to 6 carbon atoms, preferably 2 to 4 carbon atoms, and more preferably 2 to 3 carbon atoms. Specific examples of the alkenyl group represented by $R^3$ include vinyl, allyl, propenyl, isopropenyl, butenyl, and isobutenyl groups, among which preferred is vinyl group.

In the above formula (1a), in the case where either of the groups $R^3$ at both ends of the molecular chain is an alkenyl group, it is preferable that k is an integer of 100 to 1,000, m is an integer of 0 to 40, and n is 0. In the case where neither of the groups $R^3$ at both ends of the molecular chain is an alkenyl group, it is preferable that k is an integer of 100 to 1,000, m is an integer of 2 to 40, and n is 0.

Examples of the organopolysiloxane represented by the above formula (1a) include.
both end dimethylvinylsiloxy-blocked dimethylpolysiloxane,
both end dimethylvinylsiloxy-blocked dimethylsiloxane-methylvinylsiloxane copolymers,
both end dimethylvinylsiloxy-blocked dimethylsiloxane-diphenylsiloxane copolymer,
both end dimethylvinylsiloxy-blocked dimethylsiloxane-methylvinylsiloxane-diphenylsiloxane copolymers,
both end dimethylvinylsiloxy-blocked methyltrifluoropropylpolysiloxane,
both end dimethylvinylsiloxy-blocked dimethylsiloxane-methyltrifluoropropylsiloxane copolymers,
both end dimethylvinylsiloxy-blocked dimethylsiloxane-methyltrifluoropropylsiloxane-methylvinylsiloxane copolymers,
both end trimethylsiloxy-blocked dimethylsiloxane-vinylmethylsiloxane copolymers,
both end trimethylsiloxy-blocked dimethylsiloxane-vinylmethylsiloxane-diphenylsiloxane copolymers,
both end trimethylsiloxy-blocked vinylmethylsiloxane-methyltrifluoropropylsiloxane copolymers,
trimethylsiloxy dimethylvinylsiloxy-end blocked dimethylpolysiloxane,
trimethylsiloxy dimethylvinylsiloxy-end blocked dimethylsiloxane-methylvinylsiloxane copolymers,
trimethylsiloxy dimethylvinylsiloxy-end blocked dimethylsiloxane-diphenylsiloxane copolymers,
trimethylsiloxy dimethylvinylsiloxy-end blocked dimethylsiloxane-diphenylsiloxane-methylvinylsiloxane copolymers,
trimethylsiloxy dimethylvinylsiloxy-end blocked methyltrifluoropropylpolysiloxane,
trimethylsiloxy dimethylvinylsiloxy-end blocked dimethylsiloxane-methyltrifluoropropylsiloxane copolymers,
trimethylsiloxy dimethylvinylsiloxy-end blocked dimethylsiloxane-methyltrifluoropropylsiloxane-methylvinylsiloxane copolymers,
both end methyldivinylsiloxy-blocked dimethylpolysiloxane,
both end methyldivinylsiloxy-blocked dimethylsiloxane-methylvinylsiloxane copolymers,
both end methyldivinylsiloxy-blocked dimethylsiloxane-diphenylsiloxane copolymers,
both end methyldivinylsiloxy-blocked dimethylsiloxane-methylvinylsiloxane-diphenylsiloxane copolymers,
both end methyldivinylsiloxy-blocked methyltrifluoropropylpolysiloxane,
both end methyldivinylsiloxy-blocked dimethylsiloxane-methyltrifluoropropylsiloxane copolymers,
both end methyldivinylsiloxy-blocked dimethylsiloxane-methyltrifluoropropylsiloxane-methylvinylsiloxane copolymers,
both end trivinylsiloxy-blocked dimethylpolysiloxane,
both end trivinylsiloxy-blocked dimethylsiloxane-methylvinylsiloxane copolymers,
both end trivinylsiloxy-blocked dimethylsiloxane-diphenylsiloxane copolymers,
both end trivinylsiloxy-blocked dimethylsiloxane-methylvinylsiloxane-diphenylsiloxane copolymers,
both end trivinylsiloxy-blocked methyltrifluoropropylpolysiloxane,
both end trivinylsiloxy-blocked dimethylsiloxane-methyltrifluoropropylsiloxane copolymers, and
both end trivinylsiloxy-blocked dimethylsiloxane-methyltrifluoropropylsiloxane-methylvinylsiloxane copolymer.

The viscosity of the organopolysiloxane is not particularly limited. In view of good workability in handling the composition and good strength and fluidity of the cured product obtained, the viscosity as measured at 25° C. by a rotational viscometer is preferably 50 to 100,000 mPa·s, more preferably 1,000 to 50,000 mPa·s.

Next, the component (B) reacts with the above-mentioned component (A), and acts as a crosslinking agent. The component (B) is an organohydrogenpolysiloxane having at least 2 silicon-bonded hydrogen atoms (the expression "silicon-bonded hydrogen atom" used herein means a hydrogen atom bonded to a silicon atom, namely, it means a SiH group (hydrosilyl group)) in one molecule. The number of the silicon-bonded hydrogen atoms in the organohydrogenpolysiloxane is preferably 2 to 30, more preferably 2 to 10, and most preferably 2 to 5 in one molecule.

The silicon-bonded hydrogen atoms contained in the organohydrogenpolysiloxane may be located at an end of the molecular chain or an intermediate position of the molecular chain, or at both of them. Although the molecular structure of the organohydrogenpolysiloxane is not specifically restricted, it may be any of straight chain, cyclic, branched chain, and three-dimensional network (resinous) structures.

The number of the silicon atoms in one molecule of the organohydrogenpolysiloxane (in other words, the polymerization degree of the organohydrogenpolysiloxane) is 20 to 1,000. From the viewpoint of good workability in handling the composition and good characteristics (low elastic modulus, low stress) of the cured product obtained, the number of silicon atoms in one molecule is preferably 40 to 1,000, more preferably 40 to 400, further preferably 50 to 300, still further preferably 100 to 300, and most preferably 160 to 300.

The viscosity of the organohydrogenpolysiloxane as measured at 25° C. by a rotational viscometer is 10 to 100,000 mPa·s, more preferably 200 to 50,000 mPa·s, and most preferably 500 to 25,000 mPa·s. Thus, an organohydrogenpolysiloxane which is liquid at room temperature (25° C.) is preferably used.

As the organohydrogenpolysiloxane, there is preferably used an organohydrogenpolysiloxane having the following average compositional formula (2):

$$R^4{}_c H_d SiO_{(4-c-d)/2} \quad (2)$$

where $R^4$ is independently an unsubstituted or substituted monovalent hydrocarbon groups which does not have any aliphatic unsaturated bond, c is a positive number of 0.7 to 2.2, and d is a positive number of 0.001 to 0.5, and c+d is 0.8 to 7.5.

In the above formula (2), $R^4$ is independently an unsubstituted or substituted monovalent hydrocarbon group which does not have any aliphatic unsaturated bond, and which has 1 to 10 carbon atoms, preferably 1 to 6 carbon atoms. Specific examples of the groups $R^4$ include: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and groups obtained by substituting at least one of the hydrogen atoms of these groups by a halogen atom such as chlorine, bromine, and fluorine, such as 3,3,3-trifluoropropyl group. Among these groups, preferred are the alkyl groups, aryl groups, and 3,3,3-trifluoropropyl group, and more preferred are methyl, phenyl, and 3,3,3-trifluoropropyl groups.

In addition, c is preferably a positive number of 1.0 to 2.1, while d is preferably a positive number of 0.001 to 0.1, more preferably a positive number of 0.005 to 0.1, further preferably a positive number of 0.005 to 0.05, and most preferably a positive number of 0.005 to 0.03. Besides, c+d is preferably in the range from 1.0 to 2.5, and is more preferably in the range from 1.5 to 2.2.

Examples of the organohydrogenpolysiloxane represented by the above formula (2) include
methylhydrogensiloxane-dimethylsiloxane cyclic copolymers,
both end trimethylsiloxy-blocked methylhydrogenpolysiloxane,
both end trimethylsiloxy-blocked dimethylsiloxane-methylhydrogensiloxane copolymers,
both end dimethylhydrogensiloxy-blocked dimethylpolysiloxane,
both end dimethylhydrogensiloxy-blocked dimethylsiloxane-methylhydrogensiloxane copolymers,
both end trimethylsiloxy-blocked methylhydrogensiloxane-diphenylsiloxane copolymers,
both end trimethylsiloxy-blocked methylhydrogensiloxane-diphenylsiloxane-dimethylsiloxane copolymers,
both end dimethylhydrogensiloxy-blocked methylhydrogensiloxane-dimethylsiloxane-diphenylsiloxane copolymers,
copolymers composed of $(CH_3)_2HSiO_{1/2}$ units and $(CH_3)_3SiO_{1/2}$ units and $SiO_{4/2}$ units,
copolymers composed of $(CH_3)_2HSiO_{1/2}$ units and $SiO_{4/2}$ units, and
copolymers composed of $(CH_3)_2HSiO_{1/2}$ units and $(C_6H_5)_3SiO_{1/2}$ units and $SiO_{4/2}$ units.

The amount of component (B) is at least 1 part by weight, preferably at least 3 parts by weight based on 100 parts by weight of the component (A). Considering the upper limit of the amount, the amount is preferably 15 to 500 parts by weight, more preferably 20 to 500 parts by weight, and further preferably 30 to 200 parts by weight per 100 parts by weight of component (A). While satisfying the above-mentioned condition, the amount of this component (B) should be such that the number of the silicon-bonded hydrogen atoms present in this component (B) per one silicon-bonded alkenyl group present in the component (A) is in the range of 0.3 to 2.5, preferably 0.5 to 2, and more preferably 0.6 to 0.5. If this amount is less than 1 part by weight, the cured product obtained is susceptible to oil bleeding. If the number of silicon-bonded hydrogen atoms per one silicon-bonded alkenyl group is less than 0.3, the crosslink density would be so low that the composition obtained may fail to be cured, or, even if cured, the cured product may show lowered heat resistance. If the number of silicon-bonded hydrogen atoms per one silicon-bonded alkenyl group is more than 2.5, foaming due to a dehydrogenation reaction or lowering in the heat resistance of the cured product obtained or generation of oil bleeding may result.

Furthermore, the component (C) is used as a catalyst for accelerating an addition reaction between the silicon-bonded alkenyl groups in the component (A) and the silicon-bonded hydrogen atoms in the component (B). The component (C) is a platinum catalyst (platinum or a platinum compound), and those which have been known can be used. Specific examples of the platinum catalyst include: platinum black, chloroplatinic acid, or alcohol-modified products of chloroplatinic acid; and complexes of chloroplatinic acid with olefin, aldehyde, or vinylsiloxane or acetylene alcohol.

The amount of this component (C) may be an effective amount, which can be appropriately increased or decreased according to a desired curing rate. The amount, in terms of the weight of platinum atoms based on the total amount of the component (A) and the component (B), is 0.1 to 1,000 ppm, preferably 1 to 300 ppm. If the amount is too large, the cured product obtained may show lowered heat resistance.

The silicone gel composition can be prepared by mixing the above-mentioned components (A) to (C) (inclusive of optional components, if used) according to an ordinary method. In the case of mixing, the components to be mixed may be mixed after divided into two or more parts, as required. For instance, the components (A) to (C) may be mixed after divided into a part consisting of a portion of the component (A) and the component (C) and a part consisting of the remainder of the component (A) and the component (B).

In the case of curing the silicone gel composition to obtain a silicone gel, the curing conditions are preferably a temperature of 80 to 150° C. and a time of five to 3.0 minutes, according to an ordinary curing method.

Now, a process of manufacturing the solar cell module by use of the silicone gel sheets obtained as above will be described below.

First, in the case where a protective film is adhered to the silicone gel sheet, the protective film is peeled off. Thereafter a first silicone gel sheet is adhered to one surface (an inner surface in manufacturing the solar cell module) of the transparent light receiving panel which will be a sunlight incidence surface. In this instance, a space with a width of 5 to 20 mm is left intact in a picture frame-like shape as a space in which to dispose butyl rubber in a later step. Similarly, a second silicone gel sheet to be adhered to the light non-receiving panel or back sheet on the side opposite to the light receiving surface is deprived of the protective film, and is thereafter adhered to one surface (inner surface) of the light non-receiving panel or back sheet. In this instance, a space with a width of 5 to 20 mm is also left intact in a picture frame-like shape as a space in which to dispose butyl rubber in a later step (see FIG. 1).

Figure 1:
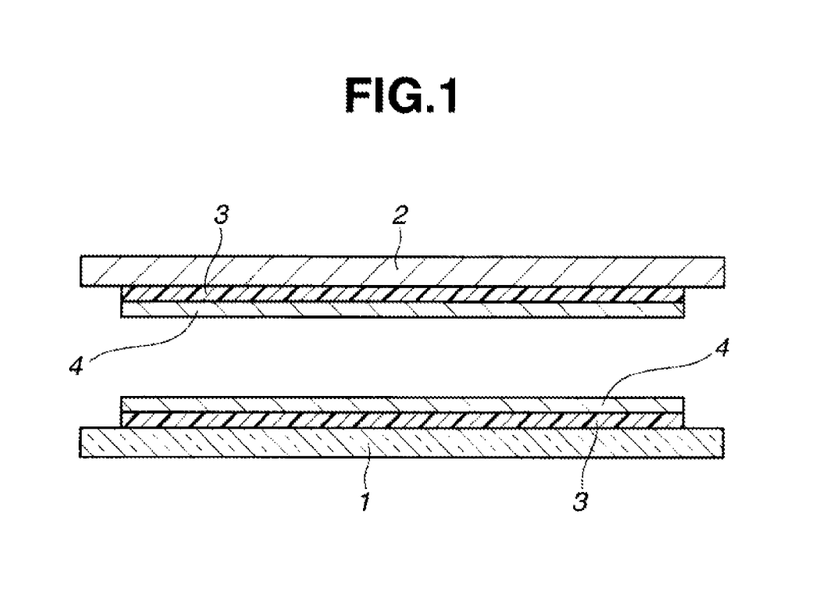
FIG. 1 is a sectional view of a state in which silicone gel sheets each of which is laminated on a base member are adhered to a light receiving panel and a light non-receiving panel or back sheet.

Incidentally, in FIG. 1, numeral 1 denotes the transparent light receiving panel, numeral 2 denotes the light non-receiving panel or back sheet, numeral 3 denotes the silicone gel sheet, and numeral 4 denotes the base member.

Figure 2:
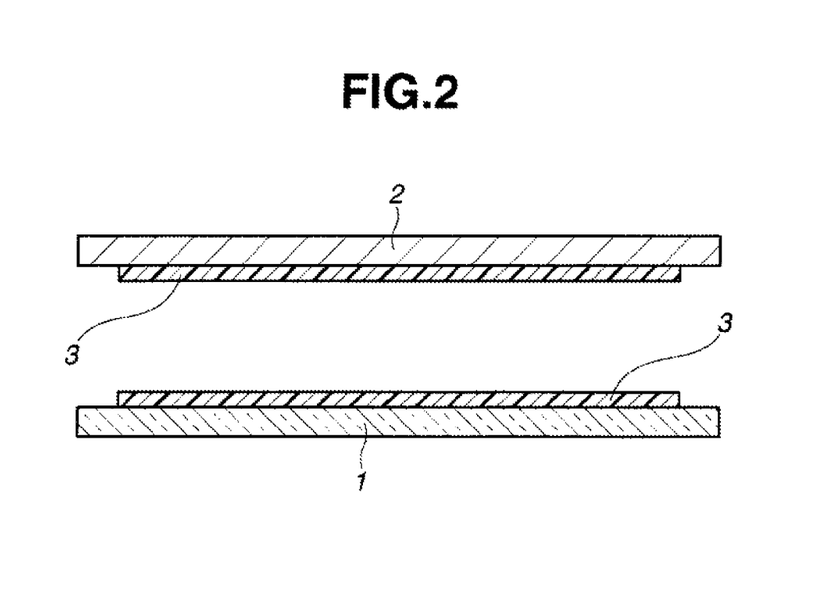
FIG. 2 is a sectional view of a state in which the base members are peeled from the silicone gel sheets in the state shown in FIG. 1.
Figure 3:
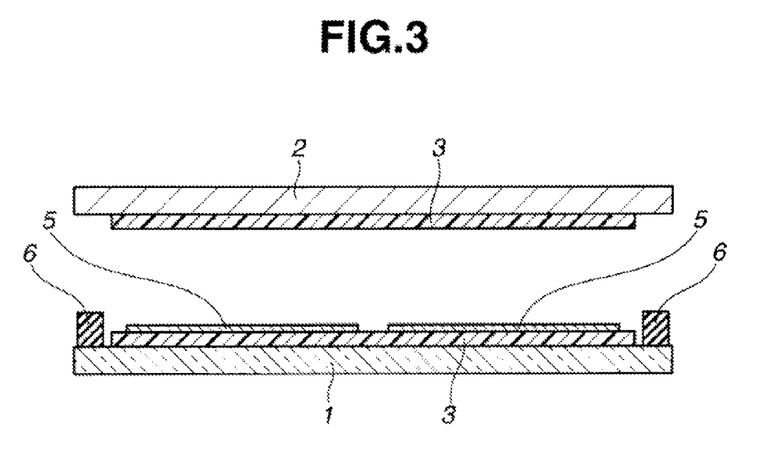
FIG. 3 is a sectional view of a state in which solar cell strings are disposed over the light receiving panel in the state shown in FIG. 2, and butyl rubber is disposed along an outer peripheral portion of the silicone gel sheet.

Next, the base members on the silicone gel sheets adhered to the panel on the light receiving surface side and the panel or back sheet on the opposite side are peeled off (FIG. 2). Thereafter, a solar cell string is arranged on the first silicone gel sheet adhered to the light receiving surface side panel, and, simultaneously, butyl rubber is disposed in a picture frame-like shape with a width of 5 to 20 mm at en outer peripheral portion of the light receiving panel along an outer peripheral portion of the first silicone gel sheet (FIG. 3). Incidentally, in the figure, numeral 5 denotes the solar cell string, and numeral 6 denotes the butyl rubber.

In this case, a process reverse to the above may also be adopted. In the reverse process, the solar cell string is first arranged on the second silicone gel sheet on the light non-receiving panel or hack sheet on the side opposite to the light receiving surface. Simultaneously, butyl rubber is disposed in a picture frame-like shape with a width of 5 to 20 mm at an outer peripheral portion of the light non-receiving panel or back sheet on the side opposite to the light receiving surface along an outer peripheral portion of the second silicone gel sheet. Incidentally, the solar cells are produced by use of single-crystal silicon and/or polycrystalline silicon, and the solar cell string is a group of solar cells interconnected by tab wires.

In making the light receiving panel, a member having good long-term reliability in outdoor use in addition to good transparency, weatherability and impact resistance is needed. Examples of the member satisfying these conditions include tempered white glass, acrylic resin, fluoro-resin, and carbonate resin; in general, a tempered white glass with a thickness of about 3 to 5 mm is widely used.

In addition, the butyl rubber for use is a rubber preliminarily processed into a tape-like shape or a cord-like shape by use of a hot melt applicator. The butyl rubber may be of the commonly commercialized type. Since the butyl rubber is subjected to a temperature of 100 to 150° C. during the vacuum lamination in the subsequent step, however, the butyl rubber is preferably of the hot melt type that can keep its shape in the temperature range; for example, butyl rubber M-155P (produced by The Yokohama Rubber Co., Ltd.) is used.

Figure 4:
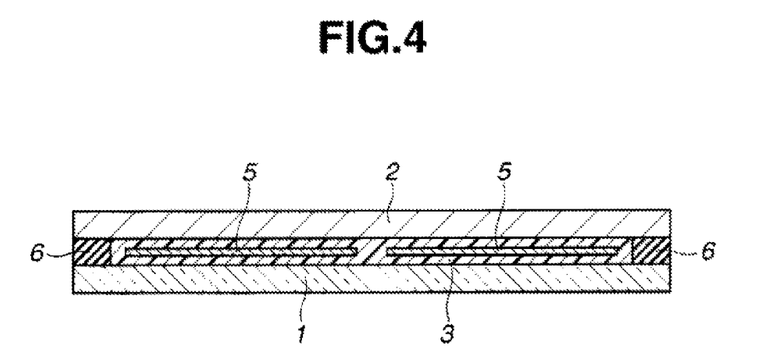
FIG. 4 is a sectional view of a solar cell module in which the solar cell strings are encapsulated between the silicone gel sheets by a vacuum laminator.

Next, the light non-receiving panel or back sheet on the side opposite to the light receiving surface with the silicone gel sheet adhered thereto is disposed over the light receiving panel on which the solar cell string and the butyl rubber have been disposed. Air present in the gap between the surface of the first silicone gel sheet on the light receiving surface side and the surface of the second silicone gel sheet on the side opposite to the light receiving surface is removed at a reduced pressure, or in vacuum, by the vacuum laminator, and thereafter they are pressed at the atmospheric pressure while heating to 100 to 150° C. for one to five minutes, so as to press bond them through the butyl rubber disposed in the picture frame-like shape, thereby manufacturing the solar cell module (FIG. 4). In this case, the surface of the first or second silicone gel sheet on the light receiving surface side or on the side opposite to the light receiving surface may preliminary be subjected to a plasma irradiation treatment or an excimer laser beam irradiation treatment to activate the surface of the silicone gel sheet, before pressing in vacuum with heating.

Here, the light non-receiving panel on the side opposite to the light receiving surface is required to efficiently radiate the heat of the solar cell string (or to efficiently lower the temperature of the solar cell string). Therefore, examples of the material for the light non-receiving panel include glass materials, synthetic resins materials, metallic materials, and their composite members. Examples of the glass materials include blue plate glass, white plate glass, and tempered glass. Examples of the synthetic resin materials include acrylic resins, polycarbonate (PC) resins, polyethylene terephthalate (PET) resins, and epoxy resins. Examples of the metallic materials include copper, aluminum, and iron. Examples of the composite members include synthetic resins supporting thereon a high thermal conductivity material such as silica, titanium oxide, alumina, or aluminum nitride.

Incidentally, as the light non-receiving panel on the side opposite to the sunlight incidence side, there may be used a member which is transparent, like the panel on the side of incidence of sunlight. This ensures that the direct reaching sunlight and the scattered light thereof can be partly transmitted to the side opposite to the sunlight incidence side. Consequently, for example where the solar cell module is installed on grassland, the part on the side opposite to the incidence surface of the solar cell module, or the part which would originally be in the shade is also irradiated with part of the sunlight, whereby growth of plants can be promoted and utilization for grazing of cattle can be realized.

In addition, in the case of using the back sheet, specific examples of the back sheet include films ETFE (ethylene-tetrafluoroethylene copolymer) films, fluoro-resin films such as PVF (polyvinyl fluoride) films, and laminate sheets having an aluminum foil or PET film sandwiched between PVF sheets.

EXAMPLES

Now, the present invention will be described in detail below by way of Examples and Comparative Examples. In the Examples, "parts" means "parts by weight," "%" means "wt %," and "Vi" represents "vinyl group." In addition, viscosity is given in values as measured at 25° C. by a rotational viscometer.

Example 1

100 parts of a both end dimethylvinylsiloxy-blocked dimethylpolysiloxane having a viscosity of 10,000 mPa·s, 63 parts of both end trimethylsiloxy-blocked dimethylsiloxane-methylhydrogensiloxane copolymer represented by the following formula (3):

and having a viscosity of 10,000 mPa·s (the number of silicon-bonded hydrogen atoms in the component (B) per one silicon-bonded alkenyl group in the component (A) (the number will hereinafter be referred to as H/Vi) was 1.05), and 0.05 parts of a dimethylpolysiloxane solution of a vinylsiloxane chloroplatinate complex having a concentration of 1% as platinum atoms, were mixed uniformly to obtain a composition. The composition thus obtained was heated at 150° C. for 30 minutes in an oven to obtain a cured product having a penetration of 75. Incidentally, the penetration was measured by use of a ¼ cone according to JIS K 2220; specifically, the penetration was measured by use of an automatic penetration tester RPM-101 produced by Rigo Co., Ltd.

Next, using the above-mentioned materials, a silicone gel sheet was produced. A comma coater was charged with the above-mentioned materials, and a 50 μm-thick polyethylene terephthalate (PET) film as a base member was coated with she composition, with such a control as to promise an overall thickness of 250 μm. Further, the coating film thus obtained was cured at 150° C. for 30 minutes in an oven to obtain a silicone gel sheet. A protective film was laminated onto the silicone gel side of the silicone gel sheet to obtain a roll of silicone gel sheet.

From the silicone gel sheet roll thus obtained, two sheets measuring 320 mm by 340 mm were blanked. First, the protective films were peeled off from the two silicone gel sheets, and each of the silicone gel sheets was adhered to a 3.2 mm-thick tempered white glass measuring 340 mm by 360 mm, leaving a space with a width of 10 mm along the outer periphery. After the adhesion, the PET base member was peeled from each silicone gel sheet surface, and the exposed surface was irradiated with excimer laser beams of 172 nm in wavelength. Then, single-crystal solar cell strings were arranged on the surface of the silicone gel sheet on the light receiving surface side, and, further, butyl rubber in a cord-like shape with a diameter of 6 mm was disposed in a picture frame-like shape in the space area with a width of 10 mm along the outer periphery. The resulting assembly was placed on a vacuum laminator, another tempered white glass (with the silicone gel sheet adhered thereto) on the side opposite to the light receiving surface was laid thereon, and they were pressed in a vacuum atmosphere at the atmospheric pressure at 120° C. for five minutes, to encapsulate the solar cell strings, thereby manufacturing a solar cell module A.

(Evaluation of Crack in Solar Cell Element)

Evaluation of cracks in the solar cell module A was conducted. The evaluation was carried out by visual inspection or EL (electroluminescence) light emission method, according to an ordinary method.

(Evaluation by Severe Deterioration Test)

The solar cell module A was put to a severe deterioration test by PCT (pressure cooker test). The test conditions were a temperature of 125° C., a humidity of 95%, a pressure of 2.1 atm, and a time of 100 hours. After the test, evaluation of cracks by the EL light emission method, evaluation of the presence/absence of corrosion of the tab wires by visual inspection, and evaluation of the presence/absence of intrusion of water (moisture) into the module by visual inspection were conducted.

Example 2

A comma coater was charged with the uniform liquid mixture obtained in Example 1, and a 50 μm-thick polyethylene terephthalate (PET) film as a base member was coated with the mixture, with such a control as to promise an overall thickness of 550 μm. Subsequently, a solar cell module B was manufactured in the same manner as in Example 1. The solar cell element was put to evaluation of cracking and a severe deterioration test.

Example 3

A comma coater was charged with the uniform liquid mixture obtained in Example 1, and a 50 μm-thick polyethylene terephthalate (PET) film as a base member was coated with the mixture, with such a control as to promise an overall thickness of 850 μm. Subsequently, a solar cell module C was manufactured in the same manner as in Example 1. The solar cell element was put to evaluation of cracks and a severe deterioration test.

Example 4

100 parts of a both end dimethylvinylsiloxy-blocked dimethylpolysiloxane having a viscosity of 12,000 mPa·s, 25 parts of a both end dimethylhydrogensiloxy-blocked dimethylsiloxane-methylhydrogensiloxane copolymer represented by the following formula (4):

and having a viscosity of 2,000 mPa·s (H/Vi was 1.3), and 0.05 parts of a dimethylpolysiloxane solution of a vinylsiloxane chloroplatinate complex having a concentration of 1% as platinum atoms were uniformly mixed to obtain a composition. The composition was heated in an oven at 150° C. for 30 minutes to obtain a cured product with a penetration of 40.

Next, a comma coater was charged with the above-mentioned material, and a 50 μm-thick polyethylene terephthalate (PET) film as a base member was coated with the material, with such a control as to promise an overall thickness of 250 μm. Subsequently, a solar cell module D was manufactured in the same manner as in Example 1, except that one of the two silicone gel sheets blanked as above was, after peeling off the protective film therefrom, adhered to a 25 μm-thick ETFE film measuring 340 mm by 360 mm prepared as a back sheet, leaving the space with a width of 10 mm along the outer periphery. The solar cell element was put to evaluation of cracks and a severe deterioration test.

Example 5

A comma coater was charged with the uniform liquid mixture obtained in Example 4, and a 50 μm-thick polyethylene terephthalate (PET) film as a base member was coated with the mixture, with such a control as to promise an overall thickness of 550 μm. Next, a solar cell module E was manufactured in the same manner as in Example 4, and the solar cell element was put to evaluation of cracks and a severe deterioration test.

Example 6

A comma coater was charged with the uniform liquid mixture obtained in Example 4, and a 50 μm-thick polyethylene terephthalate (PET) film as a base member was coated with the mixture, with such a control as to promise an overall thickness of 850 μm. Next, a solar cell module F was manufactured in the same manner as in Example 4, and the solar cell element was put to evaluation of cracks and a severe deterioration test.

Example 7

100 parts of a both end trimethylsiloxy-blocked dimethylsiloxane-methylvinylsiloxane copolymer represented by the following formula (5):

and having a viscosity of 10,000 mPa·s, 40 parts of a both end dimethylhydrogensiloxy-blocked dimethylpolysiloxane represented by the following formula (6):

(6)

and having a viscosity of 6,000 mPa·s (H/Vi was 0.95), and 0.05 parts of a dimethylpolysiloxane solution of a vinylsiloxane chloroplatinate complex having a concentration of 1% as platinum atoms were mixed uniformly to obtain a composition. The composition was heated in an oven at 150° C. for 30 minutes to obtain a cured product with a penetration of 120.

A comma coater was charged with the above-mentioned material, and a 50 μm-thick polyethylene terephthalate (PET) film as a base member was coated with the material, with such a control as to promise an overall thickness of 250 μm. A solar cell module C was manufactured in the same manner as in Example 1, and the solar cell element was put to evaluation of cracks and a severe deterioration test.

Example 8

A comma coater was charged with the uniform liquid mixture obtained in Example 7, and a 50 μm-thick polyethylene terephthalate (PET) film as a have member was coated with the mixture, with such a control as to promise an overall thickness of 550 μm. Subsequently, a solar cell module H was manufactured in the same manner as in Example 7, and the solar cell element was put to evaluation of cracks and a severe deterioration test.

Example 9

A comma coater was charged with the uniform liquid mixture obtained in Example 7, and a 50 nm-thick polyethylene terephthalate (PET) film as a base member was coated with the mixture, with such a control as to promise an overall thickness of 850 μm. Next, a solar cell module I was manufactured in the same manner as in Example 7. The solar cell element was put to evaluation of cracks and a severe deterioration test.

Example 10

A solar cell module J was manufactured in the same manner as in Example 1, except that the base member was coated with the uniform liquid mixture obtained in Example 1 by use of a comma coater in the same manner as in Example 2, with such a control as to promise an overall thickness of 550 μm, to obtain one of the two silicone gel sheets on the light receiving surface side, and that the uniform liquid mixture obtained in Example 4 was applied in the same manner as in Example 5, with such a control as to promise an overall thickness of 550 μm, to obtain the other one of the two silicone gel sheets as a panel on the side opposite to the light receiving surface side. The solar cell element was put to evaluation of cracks and a severe deterioration test.

Comparative Example 1

A comma coater was charged with the uniform liquid mixture obtained in Example 4, and a 50 μm-thick polyethylene terephthalate (PET) film as a time member was coated with the mixture, with such a control as to promise an overall thickness of 550 ml, to obtain a roll of silicone gel sheet. From this silicone gel sheet roll, two sheets measuring 340 mm by 360 mm were blanked. Next, a solar cell module K was manufactured in the same manner as in Example 4, except that butyl rubber was not disposed in the picture frame-like shape. The solar cell element was put to evaluation of cracks and a severe deterioration test.

Comparative Example 2

Using two sheets of 500 μm-thick transparent film of EVA (ethylene-vinyl acetate copolymer; with a vinyl acetate content of 28%), a single-crystal silicon solar cell element was encapsulated between two tempered white glass base members measuring 340 mm by 360 mm, based on an ordinary method. The encapsulation was carried out through melt pressure bonding by use of a vacuum laminator in a vacuum atmosphere with heating at 120° C. for 30 minutes, to thereby manufacture a solar cell module L. The solar cell element was put to evaluation of cracks and a severe deterioration test.

The results of the crack evaluation and the severe deterioration test are set forth in Table 1, together with the above-mentioned conditions.

TABLE 1

| | Module | Light receiving surface silicone gel sheet | | Back surface silicone gel sheet | | Number of cracks, detected by EL observation | Observation after PCT severe deterioration test | | |
|---|---|---|---|---|---|---|---|---|---|
| | | Penetration | Film thickness (μm) | Penetration | Film thickness (μm) | | Number of cracks | Corrosion of tab wire | Intrusion of water |
| Example 1 | A | 75 | 200 | 75 | 200 | 0 | 1 | absent | absent |
| Example 2 | B | 75 | 500 | 75 | 500 | 0 | 0 | absent | absent |
| Example 3 | C | 75 | 800 | 75 | 800 | 0 | 0 | absent | absent |
| Example 4 | D | 40 | 200 | 40 | 200 | 1 | 2 | absent | absent |
| Example 5 | E | 40 | 500 | 40 | 500 | 0 | 0 | absent | absent |
| Example 6 | F | 40 | 800 | 40 | 800 | 0 | 0 | absent | absent |
| Example 7 | G | 120 | 200 | 120 | 200 | 1 | 2 | absent | absent |
| Example 8 | H | 120 | 500 | 120 | 500 | 1 | 1 | absent | absent |
| Example 9 | I | 120 | 800 | 120 | 800 | 0 | 0 | absent | absent |
| Example 10 | J | 75 | 500 | 40 | 500 | 0 | 0 | absent | absent |
| Comparative Example 1 (no butyl rubber sealing) | K | 40 | 500 | 40 | 500 | 0 | 5 | present | present |

TABLE 1-continued

| | Module | Light receiving surface silicone gel sheet Penetration | Film thickness (μm) | Back surface silicone gel sheet Penetration | Film thickness (μm) | Number of cracks, detected by EL observation | Observation after PCT severe deterioration test Number of cracks | Corrosion of tab wire | Intrusion of water |
|---|---|---|---|---|---|---|---|---|---|
| Comparative Example 2 | L | EVA film/ 500 μm thick | | EVA film/ 500 μm thick | | 2 | 3 | present | present |

Japanese Patent Application No. 2012-21816 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a solar cell module comprising: adhering a first silicone gel sheet to one surface of a transparent light receiving panel to be a sunlight incidence surface except an outer peripheral region thereof; adhering a second silicone gel sheet to one surface of a light non-receiving panel or back sheet on the side opposite to the sunlight incidence surface except an outer peripheral region thereof; disposing a solar cell string on the first silicone gel sheet of the light receiving panel or on the second silicone gel sheet of the light non-receiving panel or back sheet, and disposing butyl rubber in a picture frame-like shape on the outer peripheral region of the light receiving panel or the light non-receiving panel or back sheet where the first silicone gel sheet or second silicone gel sheet is not formed; and laying the light receiving panel and the light non-receiving panel or back sheet over each other with the silicone gel sheets on the inside, and pressing them at 100 to 1 in vacuum for at least one minute but no more than five minutes to encapsulate the solar cell string with the silicone gel sheets and press bond the light receiving panel and the light non-receiving panel or back sheet to each other through the butyl rubber wherein the first silicone gel sheet and the second silicone gel sheet are obtained by curing a silicone gel composition comprising:

(A) an organopolysiloxane having at least one silicon-bonded alkenyl group in one molecule and represented by the following average compositional formula (1):

$$R_a R^1_b SiO_{(4-a-b)/2} \quad (1)$$

wherein R is an alkenyl group, $R^1$ is independently an unsubstituted or substituted monovalent hydrocarbon group not having any aliphatic unsaturated bond, a is a positive number of 0.0001 to 0.2, b is a positive number of 1.7 to 2.2, and a+b is 1.9 to 2.4;

(B) an organohydrogenpolysiloxane having at least two silicon-bonded hydrogen atoms in one molecule; and (C) a platinum catalyst, the silicone gel having a penetration of 30 to 200.

2. The method of manufacturing a solar cell module according to claim 1, wherein the thickness of the first silicone gel sheet and the second silicone gel sheet is 200 to 1,000 μm.

* * * * *